United States Patent [19]

Fisher

[11] 4,272,882
[45] Jun. 16, 1981

[54] METHOD OF LAYING OUT AN INTEGRATED CIRCUIT WITH SPECIFIC ALIGNMENT OF THE COLLECTOR CONTACT WITH THE EMITTER REGION

[75] Inventor: Albert W. Fisher, East Amwell Township, Hunterdon County, N.J.

[73] Assignee: RCA Corporation, New York, N.Y.

[21] Appl. No.: 147,574

[22] Filed: May 8, 1980

[51] Int. Cl.³ .................... H01L 21/22; H01L 21/324
[52] U.S. Cl. .................... 29/578; 29/577 C; 29/587; 148/1.5; 148/187; 357/20; 357/34; 357/48; 357/68
[58] Field of Search .................... 29/577, 578, 587; 148/187, 1.5; 357/20, 34, 48, 68

[56] References Cited

U.S. PATENT DOCUMENTS

| 3,525,911 | 8/1970 | Ryerson | 357/48 |
| 3,539,876 | 11/1970 | Feinberg et al. | 357/48 X |
| 3,557,444 | 1/1971 | Ruoff | 29/577 |
| 3,622,842 | 11/1971 | Oberai | 148/187 X |
| 3,874,936 | 4/1975 | d'Hervilly et al. | 148/187 X |
| 3,922,707 | 11/1975 | Freed et al. | 357/68 X |
| 4,131,497 | 12/1978 | Feng et al. | 148/187 |
| 4,219,369 | 8/1980 | Ogive et al. | 148/187 X |

OTHER PUBLICATIONS

Barson et al., "Gettering Technique", I.B.M. Tech. Discl. Bull., vol. 15, No. 6, Nov. 1972, p. 1752.
Murarka et al., "Study of Stacking Faults ... Contribution to Leakage" J. Electrochem. Soc., Solid-State Sci. & Tech., Mar. 1980, pp. 716–724.

Primary Examiner—R. Dean
Assistant Examiner—W. G. Saba
Attorney, Agent, or Firm—Birgit E. Morris; Donald S. Cohen; Sanford J. Asman

[57]  ABSTRACT

The method entails laying out NPN transistors in a bipolar integrated circuit in a manner which prevents crystal dislocations from making the transistor unreliable. The long edges of the collector contacts are aligned in a direction substantially perpendicular to the direction between the collector contact and the emitter-base junction.

2 Claims, 5 Drawing Figures

METHOD OF LAYING OUT AN INTEGRATED CIRCUIT WITH SPECIFIC ALIGNMENT OF THE COLLECTOR CONTACT WITH THE EMITTER REGION

BACKGROUND OF THE INVENTION

The present invention relates to the manufacture of integrated circuit semiconductor devices of the type that employ bipolar transistors. In particular, the invention relates to the layout of the collector contacts in NPN transistors.

The reliability of semiconductor devices and integrated circuits is strongly dependent upon the silicon crystal quality and upon the cleanliness of the process. Unwanted impurities, such as copper and sodium, are present in the manufacturing process even under the most stringent conditions of cleanliness. As a result, many popular techniques have been developed to reduce the affect of the unwanted impurities thereby to improve device reliability. The technique of gettering utilizes the phenomenon in which a dopant, particularly phosphorus, can act as a sink for unwanted impurities.

When a very high concentration of phosphorus (N+) is diffused into silicon, diffusion induced lattice defects will be present. There is a great tendency for undesired impurities to fix themselves into those phosphorus contact regions which have lattice damage.

In most instances, the defects do not limit themselves to the diffused regions. Dislocations are usually generated in the area surrounding the diffused regions as the silicon crystal relieves itself of the stress forces. I have found that if the surface of the silicon crystal is chemically etched to reveal the dislocations, the dislocations extend outwardly from the corners of the diffused regions.

SUMMARY OF THE INVENTION

I have found that if a rectangular contact layout is used, an annealing process which follows the formation of the contact region will remove the dislocations which extend outwardly from the shorter sides of the contact region while extending the dislocations which extend outwardly from the longer sides of the contact region.

I have also found that if such edge dislocations extend through the base region of the transistor, particularly if they extend into the emitter-base PN junction, the reliability of the NPN transistor formed will be significantly reduced. Accordingly, I concluded that the heavily doped collector contacts must be laid out as rectangles whose longer side dimensions extend substantially perpendicular to the direction between the collector contact and the emitter-base PN junction.

DETAILED DESCRIPTION OF THE DRAWINGS

Figure 1:
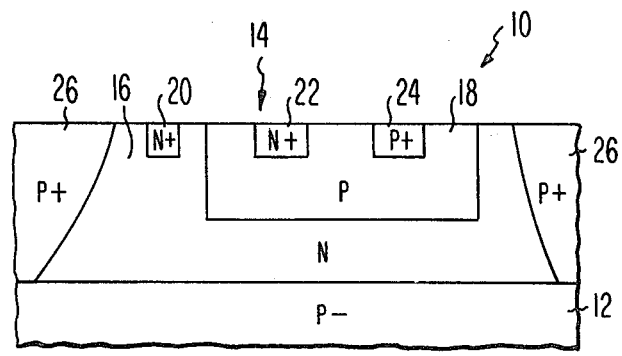
FIG. 1 is a cross-sectional view of an integrated circuit.

Referring now to FIG. 1, a cross-sectional view of a portion of an integrated circuit 10 is shown. The integrated circuit 10 is formed on a P- type substrate 12. The integrated circuit 10 includes an NPN transistor 14 which has an N type collector region 16 with a P type base region 18 and an N+ collector contact region 20 formed therein. An N+ emitter region 22 is formed in the base region 18 as is a P+ base contact 24. P+ isolation regions 26 isolate the transistor 14 from the rest of the integrated circuit 10.

Figure 2:
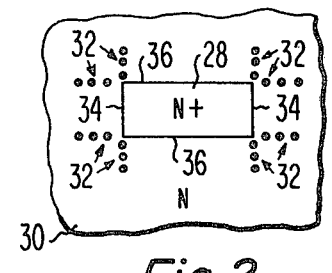
FIGS. 2 and 3 are top views of a portion of an N type substrate into which a rectangular N+ region has been diffused.

Referring now to FIG. 2, a top view of an N+ region 28 is shown. The N+ region 28 is formed within an N type region 30. A series of crystal dislocations 32 which extend outwardly from the shorter edges 34 and from the longer edge 36 of the rectangular N+ region 28 are revealed using chemical etching and optical microscopy.

Figure 3:
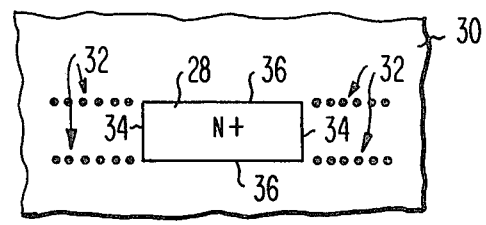

Referring now to FIG. 3, a top view of the same N+ region 28 following an anneal process is shown. Following the anneal, the crystal dislocations 32 extend outwardly a greater distance than previously from the longer edge 36 of the N+ region 28 while they are substantially removed from the shorter edges 34.

Figure 4:
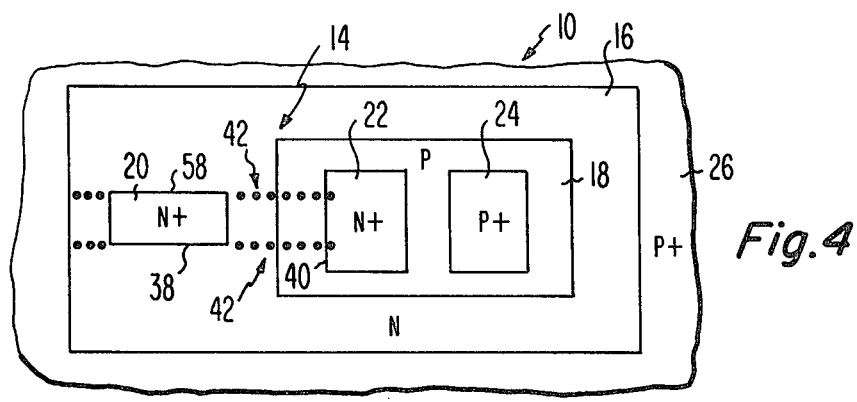
FIG. 4 is a top view of the layout of the device shown in FIG. 1 which has been used heretofore.

Referring now to FIG. 4, a top view of one possible embodiment of the transistor of FIG. 1 is shown. The layout shown in FIG. 4 has been used heretofore. The crystal dislocations 42 which extend outwardly from the long edges 38 of the collector contact region 20 extend into the P type base region 18 and into the base-emitter junction 40. I found that transistors formed in that manner are highly unreliable.

Figure 5:
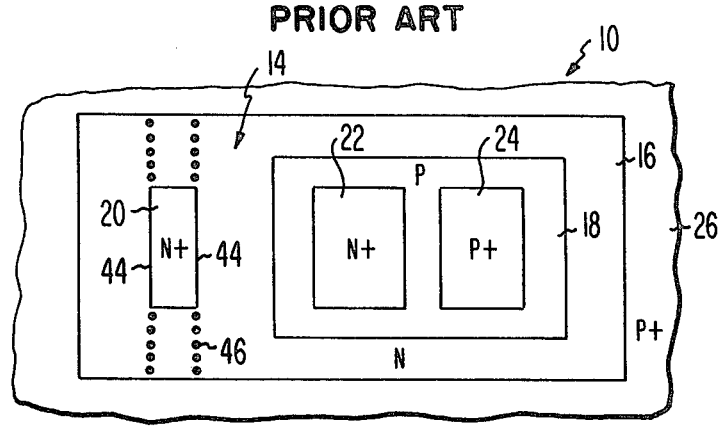
FIG. 5 is a top view of the layout of the NPN transistor shown in FIG. 1 which must be used in accordance with the present invention.

Referring now to FIG. 5, an alternative layout of the NPN transistor of FIG. 1 is shown. In the embodiment shown in FIG. 5, the longer edges 44 of the collector contact region 20 are substantially perpendicular to the direction between the collector contact region 20 and the emitter region 22. After the integrated circuit 10 has been annealed, the crystal dislocations 46 which extend outwardly from the long edges 44 of the N+ contact region 20 will not extend into the P type base region 18. I found that the transistor 14 shown in FIG. 5 will be reliable. Accordingly, I concluded that in the layout of an integrated circuit using NPN transistors of the type described, the long dimension of the N+ collector contact should never be aligned toward the base-emitter PN junction as shown in FIG. 4, but that it should be aligned in a direction perpendicular to the base-emitter PN junction as shown in FIG. 5.

I claim:

1. An improved method of laying-out an integrated circuit of the type which includes an NPN bipolar transistor having an emitter formed within a P type well which P type well is formed within an N type substrate in which a rectangular N+ collector contact is formed, wherein the improvement comprises aligning the longer edges of said N+ contact in a direction substantially perpendicular to the direction between said contact and said emitter and not aligning any of said longer edges toward said emitter.

2. The method of claim 1 further comprising the step of annealing said bipolar transistor following the diffusion of donor impurities therein.

* * * * *